United States Patent [19]

Grützediek et al.

[11] 4,361,831

[45] * Nov. 30, 1982

[54] ANALOG-DIGITAL CONVERTER UTILIZING MULTIPLE RAMP INTEGRATING TECHNIQUES

[76] Inventors: Hartmut Grützediek, Dresdner Ring 1, 6203 Hochheim; Joachim Scheerer, Am Fort Weisenau 38, 6500 Mainz, both of Fed. Rep. of Germany

[ * ] Notice: The portion of the term of this patent subsequent to Oct. 9, 1990, has been disclaimed.

[21] Appl. No.: 37,505

[22] Filed: May 10, 1979

[30] Foreign Application Priority Data

May 11, 1978 [DE] Fed. Rep. of Germany ..... 2820601

[51] Int. Cl.$^3$ ............................................ H03K 13/02
[52] U.S. Cl. .......................... 340/347 NT; 324/99 D; 340/347 M; 340/347 AD; 364/829
[58] Field of Search .... 340/347 M, 347 NT, 347 AD; 324/99 D

[56] References Cited

U.S. PATENT DOCUMENTS 3,458,809 7/1969 Dorey .......................... 340/347 NT
3,765,012 10/1973 Grutzediek et al. ........... 340/347 M
3,879,724 4/1975 McDonald ................... 340/347 NT

OTHER PUBLICATIONS

Federal Scientific Corp., Dithering Increases Dynamic Range and Improves Linearity, FSC-L-569/100, 8/1973, pp. 2–8.
The Engineering Staff of Analog Devices, Inc., Analog–Digital Conversion Handbook, 6/1972, pp. II-143.
Candy, A Use of Limit Cycle Oscillations to Obtain Robust . . . , IEEE Transactions on Communications, vol. COM-22, No. 3, Mar. 1974, pp. 298–305.
Candy et al., Using Triangularly Weighted Interpolation to Get . . . , IEEE Transactions on Communications, 11/1976, pp. 1268–1275.
Croisier, Analog to Digital Coverter, IBM Technical Disclosure Bulletin, vol. 13, No. 8, 1/1971, pp. 2347–2348.
Everard, Improvements to Delta–Sigma Modulators When Used for PCM . . . , Electronics Letters, 22 Jul. 1976, vol. 12, No. 15.

*Primary Examiner*—Thomas J. Sloyan
*Attorney, Agent, or Firm*—Frishauf, Holtz, Goodman & Woodward

[57] ABSTRACT

An analog current $I_1$, to be digitized is fed continuously to the input of an integrator. Two pulse counters, serially connected, algebraically count pulses from a pulse generator, the first pulse counter of the two setting, upon overflow, a bistable element to one of its states. The bistable element will remain in the state until the first pulse of the pulse generator, after the next changeover of the threshold switch occurs. In accordance with the state of the threshold switch, the bistable flip-flop circuit permits either a current $I_2$, or a current $I_3$ (the two currents being of opposite polarity) to be applied, simultaneously with the current $I_1$, to the integrator by suitable switches during predetermined time intervals W. The time interval W is defined as the sum of the timing intervals occurring between two successive overflow pulses of the second counter during which $I_2$ is simultaneously integrated with current $I_1$, less than the sum of the timing intervals during which current $I_1$ is integrated with current $I_3$. A digital value corresponding to the analog value of current $I_1$ is then stored, in the form of pulse counts. Unlike the somewhat similar coverter of U.S. Pat. No. 3,765,012, the digital value obtained does not become constant, but settles down to a fluctuation of $\pm\frac{1}{2}$ unit, thus providing less resolution to an extent proportional to the period of the pulse, generator. Successive values of the fluctuating result can be combined automatically in a following calculating circuit to provide a refined value having an additional decimal place, with an increase of resolution that depends upon the number of successive values combined.

10 Claims, 6 Drawing Figures (A): $U_{j,k} - \frac{1}{c} \int_0^{t_{j,k} \cdot \gamma} (I_3 + I_1) \, dt \leq 0$  for $1 \leq j \leq N$ (B): $U_{j,k} - \frac{1}{c} \int_0^{(t_{j,k}-1) \cdot \gamma} (I_3 + I_1) \, dt > 0$  for $1 \leq j \leq N$ (C): $t_{j,k} = \text{entier} \left( \frac{c}{\gamma} \cdot \frac{U_{j,k}}{I_3 + I_2} + 1 \right)$  for $1 \leq j \leq N$ (D): $W_k = \gamma \cdot \sum_{j=1}^{N} t_{j,k}$ (E): $R_k = \gamma \cdot \sum_{j=1}^{N} s_{j,k}$  with  $s_{j,k} = \frac{I_1}{I_1 + I_3} \cdot (s_{j-1,k} - T)$ for $1 \leq j \leq N$ and $s_{o,k} = s_{N,k-1}$   (F)

(G): $\left| \frac{R_k}{\gamma} - \frac{W_k}{\gamma} \right| < 1$ (H): $\lim_{k \to \infty} s_{j,k} = -T \cdot \frac{I_1}{I_3}$  and therefore (I): $\lim_{k \to \infty} R_k = -\gamma \cdot N \cdot T \cdot \frac{I_1}{I_3}$ (J): $W_k = \gamma \cdot N \cdot T \cdot \frac{I_1}{|I_2|}$ (K): $-\frac{1}{3} |I_2| < I_1 < +\frac{1}{3} |I_2|$ (L): $R_k = \left\{ \left( s_{N,k-1} + \frac{T \cdot I_1}{I_3} \right) \left( 1 - \left[ \frac{I_1}{I_1 + I_3} \right]^N \right) - N \cdot T \right\} \frac{I_1}{I_3} \cdot \gamma$

FIG. 5

ANALOG-DIGITAL CONVERTER UTILIZING MULTIPLE RAMP INTEGRATING TECHNIQUES

The present invention relates to an analog digital converter utilizing multiple ramp integrating techniques. More specifically, the converter operates with an amplifier and an integrating circuit which continuously integrates an electrical quantity, typically a current $I_1$. After constant time intervals, the current is integrated together with either one of two oppositely poled currents $I_2$ or $I_3$, for defined periods of time, utilizing a threshold switch. A pulse generator, pulse counters, logic and bistable elements are utilized to transfer pulse values occurring during the integration time to a counter in which a digital value representative of an analog current value is stored.

Analog-digital converters have been used to digitally measure electrical quantities, such as current, voltage, resistance and the like; they are used, for example, in digital measuring instruments, process control, and similar systems. The analog value is converted into a number which can be counted, the count being recorded in a counter which sums the duration of time intervals after a predetermined number of intervals which will then correspond to the digital value of a measured analog quantity.

In U.S. Pat. No. 3,765,012, an analog-digital converter was disclosed which avoided the difficulty of earlier converters of requiring relatively long time period during measurement for obtaining a final asymptotic digital value with the required level of accuracy after iterative procedures. In that device, two cascaded pulse counters continuously counted the pulses of a pulse generator for controlling a logic circuit also responsive to the condition of the threshold switch sensitive to the condition of the integrator in order to provide for the alternation between the oppositely poled auxilary currents $I_2$ and $I_3$ by means of the bistable element, and a reversible third counter was used to determine the value W equal to the difference between the sum of the time interval lengths in which the currents $I_1$ and $I_2$ were integrated together in one cycle of the second pulse generator and the sum of the time interval lengths during the same cycle of the second counter in which the current $I_1$ and $I_3$ were integrated.

With appropriate alternation of the currents $I_2$ and $I_3$ with the states of the threshold switch and by suitable magnitude of these currents relative to the analog current $I_1$, after at most a few cycles of the second counter, the digital value of the current $I_1$ would be given by a counter with suitable control of the bistable elements by the logic circuit and the overflow signal of the first counter. In the converter of the above-mentioned patent, the condition of the reversible counter used for the algebraic sum of the time periods provides the digital value of the measured analog current of voltage accurately after at most a few cycles of the second counter. The logic circuit required to provide this accurate result so quickly, according to that patent, was complicated because it was required to change the state of the bistable element (hereafter referred to as a "flip-flop"), upon overflow of the first pulse counter while the flip-flop was in a first stable state, only if (a) the threshold switch changes state or if (b) the first pulse from the pulse generator after the change of state of the threshold switch occurs, with the case (a) occurring only if the second pulse counter had reached a particular count state of its N possible count states, with the case (b) occurring in all other cases. The switching over of the flip-flop under these circumstances has the result that after a few cycles of counting of the second pulse counter, the value W given by the reversible counter remains constant and can be read out.

It can be expected from the statement of these conditions that the logic circuit necessary for control of the flip-flop in the system of our above-mentioned patent is complicated and relatively expensive to build. Furthermore, the resolution of the digital result would not be automatically raised by determination of successive measurements.

It is an object of the present invention to provide an analog digital-converter of the kind above described which at the price of only slightly less resolution can be provided with a substantially simpler construction, and, further, one that by utilization successively determined measurements can have its resolution increased, if necessary, to an extent that is substantial even in comparison with the resolution of the device of our above-mentioned patent.

SUMMARY OF THE INVENTION

Briefly, at each overflow of the first pulse counter, the flip-flop is controlled to change state, and the flip-flop resets, or changes back, when and only when the first pulse from the pulse generator occurs after the switching of the threshold switch.

The advantages of the invention are particularly to be found in that the switching over of the flip-flop in each direction from one of its stable conditions to the other is always produced in response to the same event, so that no distinction between switch-over criteria must be observed and taken care of by the circuit, as the result of which the circuit is of much simpler construction although, as above noted, the price of this simplicity is that the resolution of the converter is lowered by a factor of two compared to the converter described in our above-mentioned patent. The value W that indicates the digitalized value of the analog input, even after several cycles of counting of the second counter does not become constant, but instead merely approximates constancy to within a difference $\gamma$ that corresponds to the duration of one period of the pulse generator, which is to say, therefore, a single pulse count of the first pulse counter.

As in the case of our previous invention described in the above-mentioned patent in accordance with the feature of this invention, the currents $I_2$ and $I_3$ are of the same value and are constant. The bistable element or flip-flop, upon each overflow of the first counter, will be place in the position in which one of the two switches selecting the auxiliary current is closed so that the circuit to the current is closed and the switch is conductive. The value of W after only a few cycles of the second counter, at the most, will then continuously remain, except for a possible difference $\gamma$ dependent upon the duration of a single period of the pulse generator, proportional to the ratio of the current $I_1$ to the current $I_2$. By reducing the duration of the period of the pulse generator, the deviation from constancy may, accordingly, be reduced.

The ratio of the current $I_1$ to the current $I_2$ is recorded by counting the pulses from the pulse generator during the integration occurring when currents $I_1$ and $I_2$ are combined. This count is carried out in the forward direction by a bidirectional counter which may be regarded as an accumulator counter or a storage or recording counter. During integration of current I₃ with current I₁, this bidirectional counter counts in the reverse direction. After a cycle of the second pulse counter, the bidirectional counter in the time interval between two additional integrations of either the current I₂ or the current I₃ together with the current I₁ has as its count condition the value V which, if desired, can be supplied to means for further processing.

The bidirectional counter is reset to zero before, or at the beginning of, the next sequence integration of one of the currents I₂ or I₃ together with the current I₁. The value V approximates the value W within a difference $\gamma$ corresponding to a single period of the pulse generator, which is to say that it provides a value that deviates by at most one from a value proportional to the ratio of the current I₁ to the current I₂.

The current I₁ itself may be the sum of the current $I_e$ which is to be digitalized and an auxiliary current $I_c$. The flip-flop is placed in the condition in which one of the two switches interconnects the currents I₂ and I₃ are conductive upon the overflow of the first pulse counter. The value W after at most a few cycles of counting of the second pulse counter remains within small deviation $\gamma$ dependent upon the duration of a period of the pulse generator from a constant value.

As a further feature, the current $I_c$ is selected to be sufficiently great so that by the described summation of the currents $I_e$ and $I_c$, the current I₁ produced always has a positive polarity.

I₂ may be used to designate the one of the currents I₂ and I₃ that is of negative polarity. In the operation of the system, then, the pulses of the pulse generator during the additional integration above mentioned of the current I₂ and I₁ can be counted in a third counter which is a forward counter that operates each time after the completion of a cycle of the second counter in the subsequent period between two additional integrations of the currents I₂ and I₁, giving a count condition that can be designated as the value U which, if necessary, can be provided to apparatus for further processing.

This forward-counting third counter, before or with the beginning of the next additional integration of the current I₂ and I₁ together, is conveniently set to the value $-N \cdot T \cdot I_c / I_2$ (T is the count length of the first pulse counter and N is the count length of the second pulse counter), as the result of which the value U, after a few cycles of the second pulse counter, at most, remains, except for a deviation having a maximum of one pulse count, proportional to the ratio of the current $I_e$ to the current I₂.

According to a preferred embodiment of the invention, the resolution of the digitalized value is raised by providing calculating circuits in measured value processing apparatus to which the digitalized value is furnished, which calculating circuits determine from the fluctuation in the last position (least significant digit) of a multiplicity of counted out digitalized values of the analog current, an additional decimal position of the digital value. If these calculation circuits in the measured value processing apparatus are furnished ten different successive measurement results of digital values $W_k$, where k equals 0, 1 ... 9, and if these ten different measurement results $W_k$ have in the last decimal place, having the least significant value eight times the value 3 and twice the value 4, have an average of 3.2, then for increasing the resolution value 2 can be tacked on in a further decimal place. The last two places of the refined measurement values then are . .32.

The invention is further described by way of three illustrative examples with reference to the annexed drawings in which.

Figure 6:
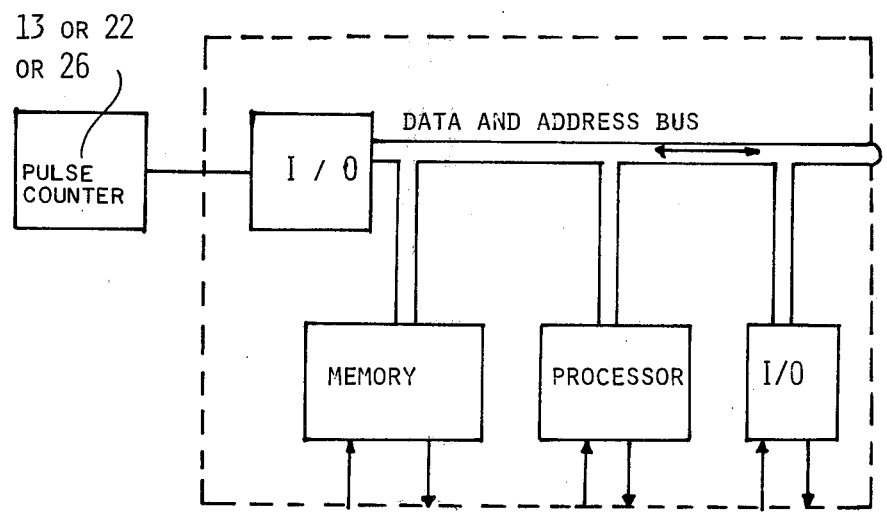

FIG. 5 is a list of mathematical formulae which will be referred to in the specification in connection with the explanation and the mathematical basis for the present invention and which are reproduced in drawing form for ease of reproduction and reading; and FIG. 6 is a block diagram of conventional calculating circuits for determining an additional decimal position from the fluctuation of the least significant digit of a multiplicity of digitalized values of analog current.

The current to be digitized I₁ (FIG. 1) is applied to an integrating amplifier 10. A pulse generator 17 in the nature of a clock-pulse generator provides pulses to a pair of series-connected pulse counters 11,12. These counters, physically, may be one single assembly. Upon overflow of counter 11, a pulse is applied to line 11' which switches the state of a bistable flip-flop 18 into one of its stable states. Flip-flop 18 can be reset by a logic circuit 23 into its other stable state. The flip-flop 18 is only brought back into its other stable state, by means of the logic circuit 23, when the first pulse from the pulse generator 17 following the switching over of the threshold switch 16 occurs.

Figure 2:
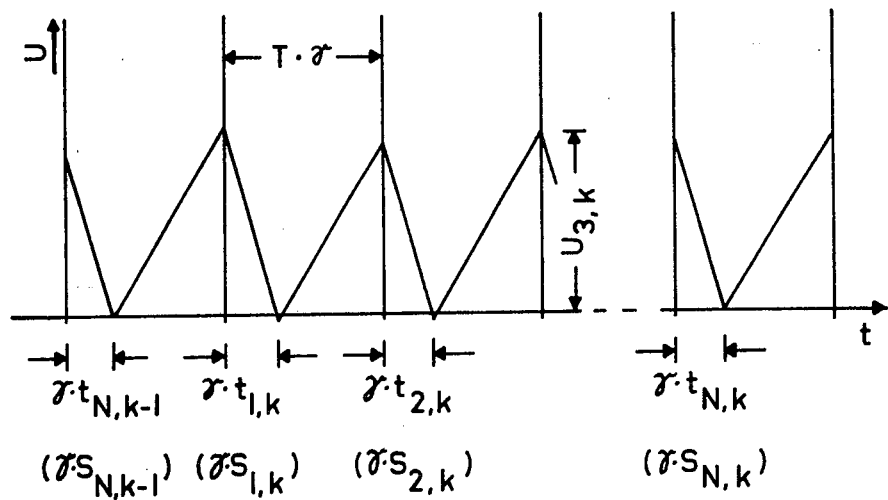
FIG. 2 is a mathematical graph to assist in the mathematical explanation of the present invention.

Flip-flop 18 will apply an output signal 18' to a pair of gates A1, A2 which, in turn, control closing switches 14,15 respectively. These gates may be AND or NAND according to how the switch-closings are controlled. The closing of the switches (i.e., energization of the lines 18') will occur when the flip-flop 18 is brought into the set condition (i.e., after overflow of the first pulse counter 11). The time period during which this occurs is indicated in FIG. 2 by $t_{j,k} \cdot \gamma$. The start of this time interval $t_{j,k} \cdot \gamma$ is determined by the time taken by the first pulse counter 11 from one overflow to the next. The information which permits either of the switches 14 or 15 to be closed (i.e., to be conductive) is determined by the AND-gates A1,A2, respectively, which are in turn controlled by the output from logic circuit 23, and will depend on the state of the threshold switch 16 at the instant of time of overflow of the first pulse counter 11.

The quantities and symbols in the following discussion can be defined as follows:

$\gamma$ is the duration of one period of the pulse generator (17), $t_{j,k} \cdot \gamma$ is the interval of time when I₂ or I₃ is integrated simultaneously with I₁ as the $k^{th}$ measurement and at the content j of the second pulse counter (12). T is the number of counts in the first pulse counter 11, and N is the number of possible counts of the second pulse counter 12. As additional conditions, $$0 \leq t_{j,k} \leq T$$

and $$1 \leq j \leq N$$

and where $t_{j,k}$ is a whole number, where $1 \leq j \leq N$ $t_{,k} = t_{N,k-1}.$ FIG. 2 illustrates the output voltage U of integrator 10 with respect to time if current $I_2$ is negative and current $I_3$ is positive during the time interval $t_{j,k}\cdot\gamma$. In this graph, the abscissa, or time axis intersects the voltage axis at the threshold voltage of the threshold switch 16. If $U_{j,k}$ is the difference of integrator and threshold voltage at the start of the time interval $\gamma\cdot t_{j,k}$, then relationships A,B and C of FIG. 5 will result.

Since $t_{j,k}$ is an integer, formulae A and B of FIG. 5 can be written as formula D, FIG. 5 wherein, "entier" (x) is the maximum integer $\leq$ x.

The unknown quantity $W_k$ is given the formula D, FIG. 5. It can be compared with the quantity $R_k$, defined in formula F of FIG. 5. This is the sum of the integrating intervals $\gamma\cdot s_{j,k}$ is their end periods, or limits are defined by the jump, or commutation of the threshold switch 16 in each of the N states of the second pulse counter 12. To determine the limit of $W_k$, it is sufficient to know the limit of $R_k$, because the relationship set forth in G, FIG. 5, will be determinative.

With the above definitions of $R_k$ and $s_{j,k}$, as a geometric progression, condition $|I_1| \leq |I_2/2|$ and sign $I_2 = -$sign $I_3$ gives formulae H and I of FIG. 5. Finally, convergence of the digital quantity $W_k$ to the limit value $-\gamma\cdot N\cdot T\cdot I_2/I_3$ is obtained. The currents $I_2$ and $I_3$ will have the same value. To determine the time intervals $\gamma\cdot t_{j,k}$ a bidirectional counter 13 is provided. This counter is reset at the overflow of the second pulse counter 12. It starts counting during the time intervals $\gamma\cdot t_{j,k}$, the pulses from pulse generator 17, counting forwardly during the simultaneous integration of the currents $I_2$ and $I_1$. It counts backward during the simultaneous integration of the currents $I_3$ and $I_1$. The bidirectional counter 13 will have the value $W_k$ therein before the next erase or reset bit is obtained from the second counter 12; just before erasing or resetting, the content of counter 13 is transferred to a storage device 20, such as a recorder, a register, an indicator, or other utilization device, such as an input to a control system.

After convergence of the process, the relationship of formula I of FIG. 5 is obtained, automatically and with the correct sign. In constrast to the operation of the converter described in U.S. Pat. No. 3,765,012, however, the digital value $W_k$ does not settle down to a constant value, but fluctuates by $\pm\frac{1}{2}$ unit step.

If in the illustrative example just considered (FIG. 1), the currents $I_2$ and $I_3$ are selected as being of the same strength and a bidirectional counter 13 is utilized to measure the periods $\gamma\cdot t_{j,k}$, which bidirectional counter is reset to zero upon overflow of the second pulse counter 12 and counts the pulses of the pulse generator 17 during the supplemental combined integration of the currents $I_2$ and $I_1$ in the forward direction, and counts in the backward direction during the supplementary integration period of the combined currents $I_3$ and $I_1$, the count condition in the counter 13 just before resetting to zero is equal to $W_k/\gamma$ and can be transferred to a recording or data processing unit 20. The positive value of $W_k$ corresponds then to a current $I_1$ that is positive in its average value. After convergence of the process, there is obtained $W_k = \gamma\cdot NT\cdot I_1/I_2$ with automatically the correct sign.

The rapidity of convergence will now be considered. Let the current values $I_1$ and $I_2$ and $I_3$ have the relationship set forth in formula K of FIG. 5. Let it further be assumed that at the start of the first measurement, current $I_1$ jumps from the value ZERO to the value $+\frac{1}{3}|I_3|$. Let it further be assumed that N = 100 and T = 3·106. Substituting, one obtains from equation L of FIG. 5, that $R_2 = R\infty(1-10^{-32})$. Even in such an unusual and unfavorable sudden jump of input voltage, the error at the second measure will be so small that it can be neglected.

Figure 1:
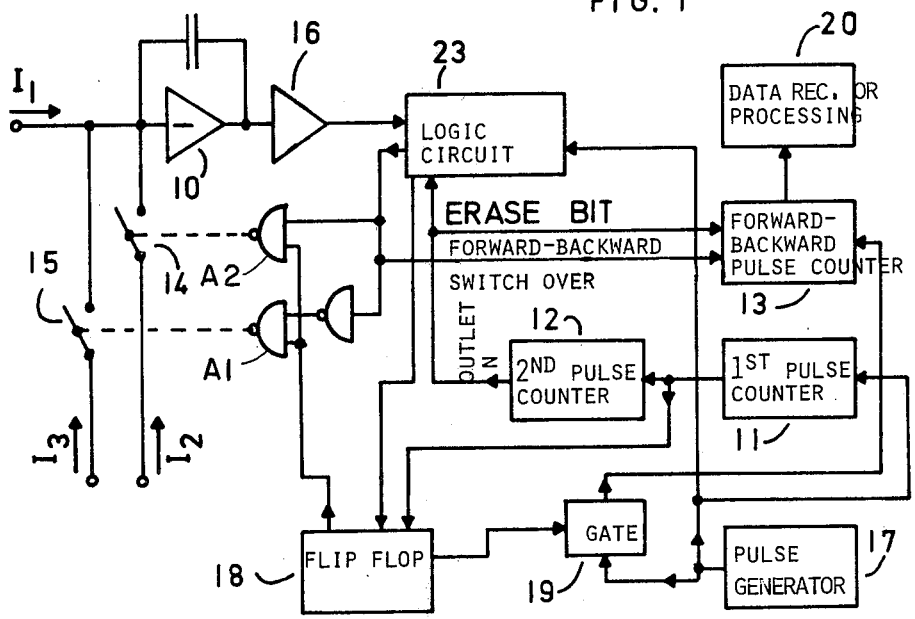
FIG. 1 is a schematic block circuit diagram of a first embodiment of the invention.
Figure 3:
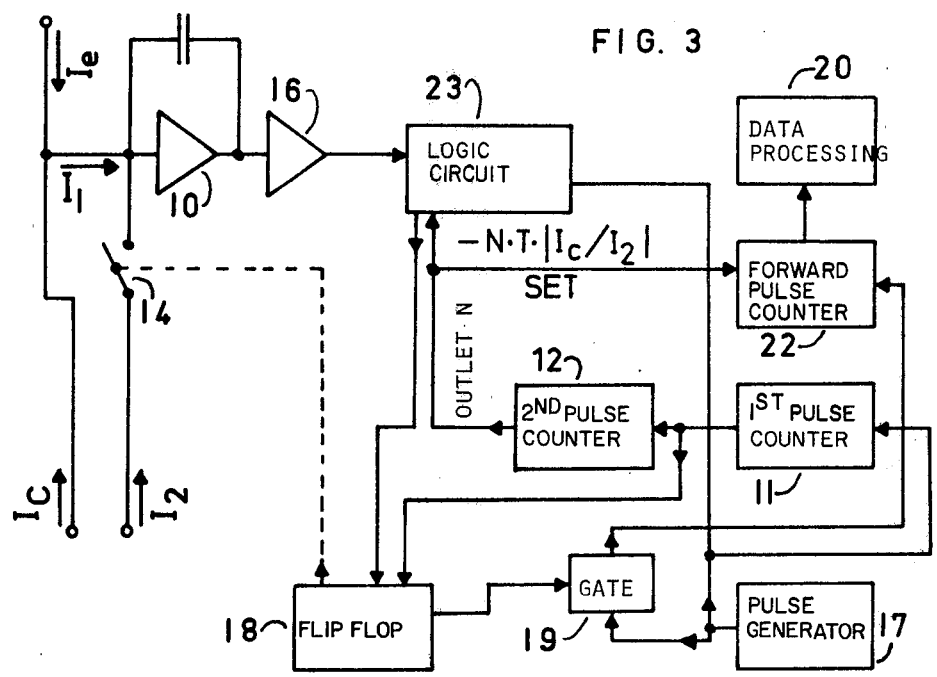
FIGS. 3 and 4 are schematic block diagram of two further embodiments of the invention.

The embodiment of the invention shown in FIG. 3 is similar to that shown in FIG. 1 (and like parts are not explained again and have been given the same reference numerals) but the bidirectional counter 13 need not be used. Only a simple pulse counter 22, counting only in forward direction, is required. Current $I_1$ is formed of a current $I_e$, the one whose digital value is to be determined, and a current $I_c$. Current $I_c$ is so selected that the combined current $I_1$ will, at all times, be of positive polarity. The current $I_2$ is of a polarity opposite to that of current $I_1$, that is, in the example negative. The flip-flop 18 is placed as in the example of FIG. 1. It need control only a single switch 14, however, which is closed each time when the first counter 11 overflows. The pulses of pulse generator 17, during simultaneous integration of current $I_2$ and current $I_1$ are then counted by the forward counter 22. Pulse counter 22, upon beginning of a new cycle of the second counter 12 is set to the content $-N\cdot T\cdot|I_c I_2|$. Before overflow of the second pulse counter (12) the content of the pulse counter 22 will have a value X, which again is read out into storage counter or recorder 20.

Mathematically, the value W, in the mathematical computation with respect to the first example, can be replaced by a value $X + N\cdot T|I_c I_2|\cdot I_1$ is replaced by $I_e + I_c$. The value x at the most after a few cycles of the second pulse counter 12 will have a value which is proportional to the ratio of the currents $I_e$ and $I_2$.

Figure 4:
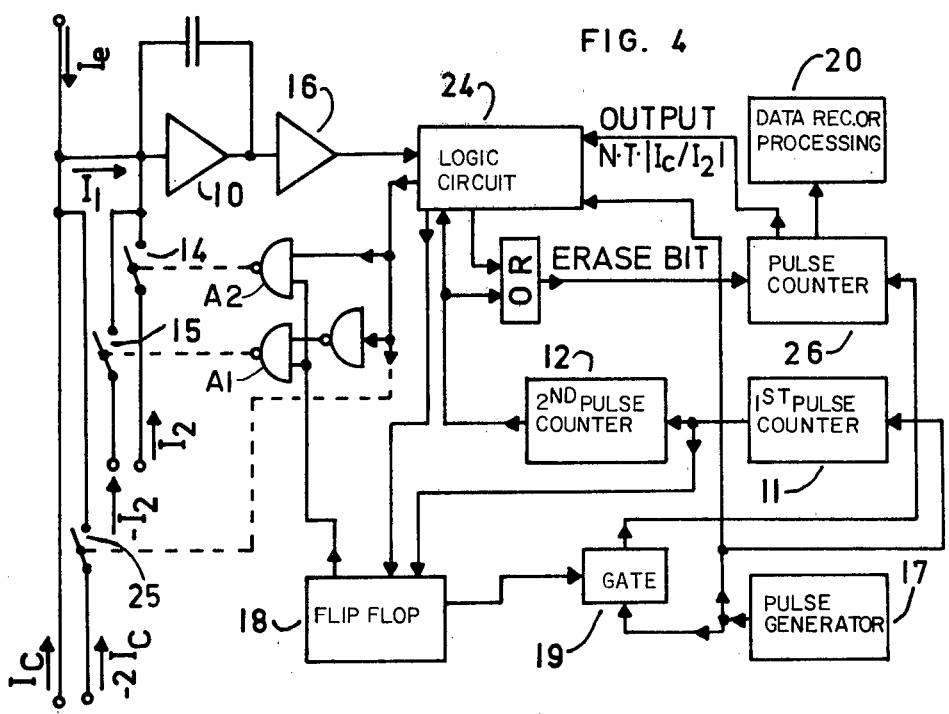

Instead of a pulse counter 22 which starts to count at the value $-N\cdot T|I_c/I_2|$, a pulse counter 26 as in FIG. 4 can be used if the polarity of the currents $I_e$ and $I_c$ is the same. Such a counter will start to count from the value zero and, during a cycle of the second pulse counter 12, upon first reaching the value $N\cdot T|I_c/I_e|$ is reset once more to zero by a modified logic circuit 24. If the range of values of the current $I_e$ is fairly substantial, so that it is difficult to satisfy the relationship of a single polarity of $I_1$, as above defined, due to the constant value of the current $I_c$, then the embodiment of FIG. 3 is preferably expanded as shown in the example of FIG. 4. In addition to the current $I_e$, one of two currents is added continuously to current $I_e$ which has a polarity equal to the current $I_e$. This then permits a current $-I_c$ to flow at all times and, instead of providing a current $-I_c$, to add a current of $-2I_c$ over a switch 25. As in the first-described example in connection with FIG. 1 for additional simultaneous integration of the now also permitted reverse polarity of current $I_1$, an additional current of $-I_2$ is required, which can be connected over the switch 15 (FIGS. 1,4). The information, with respect to which one of the two switches 14 or 15 are to be closed upon change of stage of flip-flop 18 is applied to the switches 14,15 and 25, over a gate within the logic network 24 at the beginning of a measuring cycle upon overflow of the second counter 12 on the basis of the state of the last preceding measuring, that is, according to whether or not since the last overflow of the second counter 12, the pulse counter 26 has at least once reached the value of $N\cdot T|I_c/I_2|$. If in the affirmative, then the logic circuit will render effective by the flip-flop 18 the same one of the switches 14,15 as in the preceding measuring cycle until the next overflow of the second pulse counter 12. If the last preceding count in the pulse counter 26 did not, however, reach the value of N·T|$I_c I_2$|, then logic circuit 24 will, for the duration of the next subsequent measurement, operate the other of the two respective switches 14, 15 by means of flip-flop 18. Switch 25 is so switched that it is constantly conductive during simultaneous integration of current $I_1$ if the polarity of current $I_e$ requires the addition of current $-2 I_c$, so that the respective one of the currents $-I_2$ or $-I_2$ will have the same polarity as $I_c$. Just as in the second example (FIG. 3) the pulse counter 26 can transfer the value of X into the recorder 20. This value X is, after at the most a few cycles of the second pulse counter 12, proportional to the ratio of the current $I_e$ to $I_2$. The sign of $I_e$ can be determined from the switch position of switch 25.

It should further be noted that in all described examples, the designation "pulse counter" for various subassemblies does not mean that these pulse counters in each case is to be regarded as constituted as a discrete component. Their counting operations can, rather, be partly or completely performed by one or more calculating units, preferably microprocessors, for example.

In FIG. 6 is shown a preferred embodiment of the data recording or processing unit 20 in form of a calculating circuit to which the fluctuating counter content is supplied for producing a refined result from every n input values, the refined result having an additional decimal place. Such a device could use overlapping groups of n successive count results. The last input/output unit I/O is an output means for display, printing, recording, etc. The memory in the simplest embodiment will be a RAM or a combination of a RAM and a ROM. The processor, the memory and the last input/output unit may be supplied externally with additional data and/or programs.

We claim:

1. Analog-digital converter comprising an integrator (10) having an analog input signal ($I_1$, $U_1$) continuously applied to the input thereof and continuously integrating the signal;
   means applying an auxiliary signal ($I_2, I_3, I_c$) to the integrator to cause the integrator to simultaneously integrate both the analog input signal and the auxiliary signal;
   a threshold switch (16) connected to the output of the integrator and changing state after the integrated output has reached a predetermined value;
   a pulse generator (17) providing output pulses;
   a first pulse counter (11), a bistable element (18), and a second pulse counter (12);
   the first and second pulse counters (11, 12) being connected in series and to the pulse generator to permanently count pulses of the pulse generator and the first pulse counter (11) being connected to set, at each overflow, the bistable element (18) into one of its stable states;
   and a logic network (23) connected to the threshold switch (16), the pulse generator (17), the second counter (12) and connected to and controlling the bistable element (18) to reset it to its other stable state by the output from the logic network (23), the logic network (23) providing an output when and only when the first pulse is produced by the pulse generator (17) after a change of state of the threshold switch (16) has occurred, the bistable element (18), when set upon overflow of the first counter (11), connecting said means applying the auxiliary signal to the integrator to provide an integrated representation of said auxiliary signal to the threshold switch (16) during the time interval said bistable element is in its set state;
   a third pulse counter (13,22,26) connected to said pulse generator and counting pulses from said pulse generator and having control connections with said logic network; and
   a pulse count recording means (20) connected to said third pulse counter (13,22,26) and incorporating calculating means for determining from the fluctuation of the least significant digit of said output value produced by said third counter (26) in a succession of said output values, a further decimal place for refinement of the digital value recorded;
   the logic network providing a further output controlling transfer of the count from said third pulse counter (13,22,26) to said pulse count recording means (20) and resetting said third pulse counter (13,22,26) during the time interval corresponding to two successive overflow pulses of the second counter (12) and during simultaneous integration of the analog input signal and said auxiliary signal.

2. Converter according to claim 1, wherein the third pulse counter is a bi-directional counter (13), the auxiliary signal is formed by a pair of currents ($I_2,I_3$) of opposite polarity, and said counter counts in forward direction to count the sum of time intervals occurring between two successive overflow pulses of the second counter (12) when the auxiliary signal of one polarity is integrated with the analog input signal, and the counter counts in reverse, subtracting, direction when the auxiliary signal of opposite polarity is simultaneously integrated with the analog input signal.

3. Converter according to claim 1, wherein the auxiliary signal comprises a pair of currents ($I_2,I_3$) of constant and equal value, and of opposite polarity;
   and the third counter comprises a bi-directional counter (13) and means applying the pulses from the pulse generator (17) to the bi-directional counter to be summed therein;
   a pair of switch means (14, 15) selectively connecting one or the other of the pairs of currents ($I_2,I_3$), the bi-directional counter being interconnected with said logic network and the count direction being determined by said logic network, said count direction being in forward direction when one of said switch means is closed to apply a first polarity of said auxiliary current to said integrator, and the bi-directional counter being controlled to count backwards when the auxiliary current applied thereby to the integrator is of the polarity opposite to said first polarity;
   means interconnecting the bi-directional counter (13) to erase the counter for a new count measurement upon occurrence of each overflow pulse of the second pulse counter (12);
   and means reading out the state of the bi-directional counter (13) of a value V at the end of a cycle of said second pulse counter (12) to obtain an output pulse count (V) which, except for a fluctuating difference γ not exceeding one count unit of the pulse generator (17), is proportional to the value W of the analog-digital signal to store the value of said signal in digital form, said reading out means being connected to provide said output pulse count (V)

to said further-decimal-place calculating means incorporated said recording means (20).

4. Converter according to claim 1, including a current source ($I_c$) of substantially constant current, the current source adding the constant current to the analog input signal ($I_e$) to obtain a composite analog input signal ($I_1$);

means controlling said bistable element (18) to set after overflow of pulses of said first pulse counter (11), said bistable element interrupting application of the auxiliary signal ($I_2$), whereby, after several cycles of the second pulse counter (12) the pulses applied to the pulse counter (22) will, upon each reset of the pulse counter, will provice a value that will deviate from a constant value by not more than one count unit of the pulse generator (17).

5. Converter according to claim 2, wherein the auxiliary currents ($I_2, I_3$) are of constant and equal value and of opposite polarity; and a pair of control switches are provided, each connecting either of the oppositely poled auxiliary signals to the analog input signal, the logic circuit means controlling the closing of the respective control switch in dependence on the sign of the analog input current ($I_1$), whereby after not more than a few cycles of counting of the second pulse counter (12) the count of the bi-directional counter (13) differs from a value proportional to the ratio of the current ($I_1$) representing the analog input signal to the common value of the auxiliary currents ($|I_2| = |I_3|$) by a difference not exceeding a value $\gamma$ determined by the duration of a single period of the pulse generator (17) and therefore corresponding to a single count of the first pulse counter (11).

6. Converter according to claim 2, wherein the bi-directional counter is reset for a new measurement upon each overflow pulse of the second pulse counter (12).

7. Converter according to claim 5, wherein the control switch interconnecting the auxiliary signal is opened under control of said bistable element (18) upon overflow of the first pulse counter.

8. Converter according to claim 4, wherein the additional current ($I_c$) is so dimensioned with respect to the analog input signal ($I_e$) that the modified input signal ($I_1$) always has a positive value (or negative value);

the auxiliary signal ($I_2$) always has a negative polarity (or positive polarity, respectively);

and the third pulse counter (22) is a forward-counting pulse counter, connected to said pulse generator (17) and counting the pulses from said pulse generator during the time of simultaneous integration of the derived analog input signal current ($I_1$) and the auxiliary signal current ($I_2$);

the third pulse counter (22) being reset under control of overflow of the second counter (12), the count value in said third forward counting pulse counter (22) upon reset being a digital indicated value which does not deviate by more than one count unit of the pulse generator (17) from the ratio of the analog input signal ($I_e$) and the auxiliary signal ($I_2$) after a few cycles of counting of the second pulse counter (12);

and means recording the pulse count in said third counting counter (22) in the pulse count recording means.

9. Converter according to claim 4, wherein the additional current ($I_c$) is so dimensioned with respect to the analog input signal ($I_e$) that the modified input signal ($I_1$) always has a positive value (or negative value);

the auxiliary signal ($I_2$) always has a negative polarity (or positive polarity, respectively);

and the third pulse counter (26) is a forward-counting pulse counter, connected to said pulse generator (17) and counting the pulses from said pulse generator during the time of simultaneous integration of the derived analog input signal current ($I_1$) and the auxiliary current ($I_2$);

the third pulse counter (26) being reset under control of overflow of the second counter (12), the count value in said third forward-counting pulse counter (26) upon being reset being a result value output thereof, and the resetting of said third pulse counter (26) being a setting to the value $-N \cdot T \cdot I_c / I_2$, in which N is the number of states of the second pulse counter (12) and T is the number of states of the first counter (11) in a complete cycle of the second counter, whereby said output value after not more than a few cycles of counting of the second pulse counter (12), except for a possible deviation not exceeding one, remains proportional to the ratio of the analog input signal current ($I_e$) to the auxiliary signal current ($I_2$);

and means having an input connected to the output of said third pulse counter (26) that provides said output value for recording said output value pulse count in said recording means (20).

10. Converter according to claim 8, wherein the means applying an auxiliary signal apply a plurality of auxiliary signals ($I_e$; $-2\ I_c$; $-I_2$; $+I_2$), the auxiliary signals being selected in accordance with the value of the analog input signal ($I_e$) to be expected to provide a modified input signal ($I_1$) which will always bear a predetermined relationship providing a direction of integration by said integrator (10) which will always be in a certain, predetermined direction, to permit use of a single forward-counting pulse counter device for said pulse counter.

* * * * *